(12) United States Patent
Bhattacharya et al.

(10) Patent No.: US 7,846,506 B1
(45) Date of Patent: Dec. 7, 2010

(54) METAL COATINGS FOR REDUCED FRICTION IN COMPOSITES

(75) Inventors: Rabi S. Bhattacharya, Beavercreek, OH (US); Nelson H. Forster, Bellbrook, OH (US); Hitesh Trivedi, Fairborn, OH (US); Lewis Rosado, Centerville, OH (US); Amarendra K. Rai, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 668 days.

(21) Appl. No.: 11/973,987

(22) Filed: Sep. 18, 2007

Related U.S. Application Data

(63) Continuation-in-part of application No. 10/460,690, filed on Jun. 13, 2003, now abandoned.

(60) Provisional application No. 60/890,678, filed on Feb. 20, 2007.

(51) Int. Cl.
| | |
|---|---|
| *B05D 1/36* | (2006.01) |
| *B05D 3/02* | (2006.01) |
| *C23C 16/00* | (2006.01) |
| *C25D 5/54* | (2006.01) |

(52) U.S. Cl. .......... 427/404; 427/248.1; 427/249.4; 427/249.14; 427/250; 427/383.1; 205/159

(58) Field of Classification Search .......... 424/248.1, 424/249.4, 249.14, 250, 383.1, 404; 205/159
See application file for complete search history.

(56) References Cited

U.S. PATENT DOCUMENTS

| | | | |
|---|---|---|---|
| 2,116,397 A | 11/1936 | Lapham | |
| 3,571,901 A * | 3/1971 | Sara | 29/419.1 |
| 5,495,979 A | 3/1996 | Sastri et al. | |
| 5,549,394 A | 8/1996 | Nowak et al. | |
| 5,654,059 A * | 8/1997 | Hecht | 428/65.9 |
| 5,752,773 A | 5/1998 | Rosado et al. | |
| 5,981,827 A | 11/1999 | Devlin et al. | |
| 6,090,228 A * | 7/2000 | Hwang et al. | 148/518 |
| 6,412,784 B1 | 7/2002 | Cohen | |
| 6,449,139 B1 | 9/2002 | Farahmandi et al. | |
| 6,506,482 B1 | 1/2003 | Burton et al. | |
| 6,737,120 B1 | 5/2004 | Golecki | |
| 6,802,648 B2 | 10/2004 | Merot et al. | |
| 2001/0019752 A1 | 9/2001 | Purdy et al. | |
| 2006/0234055 A1* | 10/2006 | Wu et al. | 428/408 |

OTHER PUBLICATIONS

Morimoto et al., "Multilayer Coating for Carbon-Carbon Composites", Carbon (no month, 1995), vol. 33, No. 4, pp. 351-357.*

* cited by examiner

*Primary Examiner*—Edna Wong
(74) *Attorney, Agent, or Firm*—AFMCLO/JAZ; Chris Menke

(57) ABSTRACT

The present invention provides a method for applying a tribological coating to a carbon composite substrate. The method includes providing the carbon composite substrate, depositing a layer of carbon on the substrate, applying a layer of aluminum on the layer of carbon, annealing the substrate at a temperature greater than a melting temperature of aluminum, and applying a layer of silver. A layer of mixed aluminum and silver may be substituted for the layer of silver.

18 Claims, 8 Drawing Sheets

METAL COATINGS FOR REDUCED FRICTION IN COMPOSITES

CROSS-REFERENCE TO RELATED APPLICATIONS

This application is a continuation-in-part of U.S. application Ser. No. 10/460,690 filed Jun. 13, 2003 and entitled "Seal Coating Porous Substrates for Reduced Friction," and now abandoned The present application is also related to, and claims benefit from, co-pending U.S. Provisional Patent Application No. 60/890,678, filed on Feb. 20, 2007 and entitled "Metal Coatings for Reduced Friction in Carbon-Carbon Composites." Patent application Ser. Nos. 10/460,690 and 60/783,694 are hereby incorporated by reference.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the lubrication of porous substrates, such as composite bearing members, and more particularly to coatings for sealing the surface of the substrate material for improved low friction response with conventional lubricants. The invention also relates to methods for coating composites, such as carbon-carbon composites, for improved tribological properties.

Friction and wear are fundamental considerations in the design and operation of mechanical systems, especially in advanced aerospace applications that demand high performance, reliability and long service life. State-of-the-art systems operate at higher speeds, under heavier loads and at higher environmental temperatures and extreme temperature gradients. Performance of conventional materials under operating conditions demanded by newer systems is typically marginal. Because of their unique and tailorable mechanical and physical properties, composites are a highly desirable choice for contacting, rubbing surfaces (tribo-components) operating under such extreme conditions.

The standard low cost, composite cage used today is made from a cotton fiber, phenolic matrix material (cotton-phenolic). This material is used in several large volume applications including machine tool spindle bearings. Additionally, U.S. Pat. No. 5,752,773 by Rosado et al. discloses a high performance composite cage made from carbon fibers in a carbon matrix (carbon-carbon) for gas turbine engines. This material has substantially higher temperature capability and better mechanical and thermal properties than cotton-phenolic. U.S. Pat. No. 5,752,773 is hereby incorporated by reference.

More recently, carbon fibers in phenolic matrix (carbon-phenolic) have been investigated as an intermediate cage material to replace cotton-phenolic in certain high-speed applications. Carbon-phenolic has substantially better thermal and mechanical properties than cotton-phenolic but does not have the high temperature endurance of carbon-carbon. So, each one of these materials fills a different niche: cotton-phenolic for low cost and moderate speed, carbon-phenolic for intermediate cost and high speed, and carbon-carbon for high temperature and high-speed conditions. However, all of these materials, as well as any porous composite material, has a relatively high coefficient of friction (COF), i.e. a COF greater than 0.15 is typical.

One example where these new composites will be beneficial is high-speed machine tool spindle bearings. Machine tool spindle bearings typically have cotton-phenolic cages and are lubricated with oil-mist or liquid lubrication. Thermal management and dimensional stability in the machine tool spindles is critical to maintain close dimensional tolerances on machine parts.

In another example, rolling element bearings for the next generation of gas turbine engines will operate at higher speed and load, and in higher temperature environments for improved engine performance. Thermal management of the bearing systems is critical to maintain adequate bearing life for safety and cost considerations.

Also, rolling element bearings in control moment gyroscopes and momentum flywheels for satellites typically use cotton-phenolic cages saturated with liquid lubricant. Control momentum gyroscopes and momentum flywheels can be made smaller, with lighter weight, if the rotor spins at higher speeds. Thermal management in lightly lubricated bearings is one of the primary challenges in making higher speed control moment gyroscopes and momentum flywheels.

Due to low density, high specific strength and high thermal conductivity, carbon-carbon (C—C) composites are very attractive for bearing cages used in high-speed applications or where marginal lubrication exists. Generally, liquid lubrication is used to produce the desirable low friction for the bearing cage applications. Normally with solid substrates, a friction coefficient of about 0.03 to 0.10 will be obtained if a liquid lubrication is applied between the substrates. The low friction is a result of a liquid film that forms to separate the two bodies in motion. This film is formed by hydrodynamic pressure due to motion. However, with C—C and similar composites, the porous nature of the composite does not permit the hydrodynamic film to form. The liquid gets absorbed into the bulk of the C—C composite instead of forming a lubricant film for lift off. Thus to obtain low friction, C—C composites require coatings to seal the pores to prevent the oil lubricant from seeping through thus allowing boundary lubrication. Additional coatings can further improve the response by providing lower friction at the asperity contacts of the seal coating.

Therefore, there is a need in the art for reducing the coefficient of friction of lubricated composites.

SUMMARY OF THE INVENTION

The present invention solves the critical problems associated with the prior art. That is, the present invention provides a coating on composites to substantially reduce the COF of lubricated composite, such as bearing element structures. Reducing the friction reduces bearing heat generation. This is beneficial for all bearing applications and particularly beneficial for high-speed applications where there is limited lubrication to carry away heat generated due to friction.

The invention also provides for improved adhesion of the coating by chemically reacting a layer using cathodic arc processing and further improving the performance with a tribological coating. For the present case, the reacted layer is demonstrated with cathodic arc plated aluminum (Al) and the lower friction layer is demonstrated with electro-deposited silver (Ag).

In the present invention, a coating is applied to the composite surface to seal the porosity of the composite and prevent lubricant penetration into the composite. When lubricated conventionally, the coated composite then develops a hydrodynamic lubricant film. Additionally, it is desirable that the coating have good low friction properties for enhanced boundary lubrication and good wear resistance for improved durability. Candidate coatings include silver, hexagonal boron nitride (BN), and diamond like carbon (DLC), all exhibiting good tribological performance. This technique is best when applied to carbon substrates, such as carbon-carbon composites, graphitic carbon, etc. The technique may also be applied to any porous substrate including phenolic, polyimide, poly-ether-ether-ketone (PEEK), and carbon.

The invention also provides a process that seals and coats carbon substrates with metal coatings for reduced friction. An exemplary embodiment is described for C—C bearing cages for rolling element bearings. Various steps are detailed that provide a more adherent coating. Reduced friction is obtained in two ways: (1) the metal coating provides one method to seal the porous carbon substrate, and (2) a low friction top coat of Ag is applied which improves boundary lubrication. Adherence of the coating system is improved by an initial CVD-C coating, followed by Al, followed by annealing of the Al to improve adherence to the CVD-C layer, followed by a single layer of Ag or a plasma coating mix of Al and Ag, and finished by electro-deposition of Ag.

The invention is beneficial, for example, in reducing friction in carbon composite and polymeric cages for numerous applications where the environmental temperature is below the thermal limit of the carbon or polymer substrate, typically less than 200° C. Applications where coated carbon or polymeric cages would be particularly attractive include machine tool spindle bearings, control moment gyros and flywheels in satellites, touch down sleeves for high speed rotating equipment or backup for magnetic bearings, hinges or bushings, or other applications occurring to the skilled artisan practicing the invention. The present invention will help reduce bearing heat generation and aid in thermal management. In an exemplary embodiment, the coating is applied to a carbon-carbon composite. The coating applied to cotton-phenolic and carbon-phenolic cages is two other examples of this invention applied to polymeric substrates.

For temperatures beyond the capability of a polymeric matrix, coated carbon-carbon cages may be utilized. Due to the thermal environment, sealed and coated carbon-carbon cages are particularly beneficial for gas turbine bearings, x-ray machines for medical applications, or other high-temperature applications occurring to the skilled artisan practicing lubrication.

In accordance with one aspect of the invention, there is provided a method for applying a tribological coating to a carbon composite substrate. The method includes providing the carbon composite substrate; thereafter, depositing a layer of carbon on the substrate; thereafter, applying a layer of aluminum on the layer of carbon; thereafter, annealing the substrate at a temperature greater than a melting temperature of aluminum; and thereafter, applying a layer of silver (or applying a layer of mixed aluminum and silver).

In a related aspect of the invention, the method may further include applying an additional layer of silver using electro-deposition after the step of applying the layer of silver (or applying a layer of mixed aluminum and silver).

The layer of carbon may be deposited using chemical vapor deposition. The layer of aluminum may be applied using physical vapor deposition, electron beam evaporation, sputter deposition, ion plating, chemical enhanced vapor deposition, or plasma enhanced vapor deposition.

Similarly, the layer of silver (or layer of mixed aluminum and silver) may be applied using physical vapor deposition, electron beam evaporation, sputter deposition, ion plating, chemical enhanced vapor deposition, or plasma enhanced vapor deposition.

The layer of aluminum may have a thickness of approximately 15 microns thick. The layer of silver (or layer of mixed aluminum and silver) may have a thickness of about 1 to 5 microns. The additional layer of silver applied using electro-deposition may have a thickness of about 10 to 15 microns.

It is a principal object of the invention to provide enhanced lubrication of porous substrates, such as carbon composites.

It is another object of the invention to provide coatings for porous substrates for improved friction response.

It is another object of the invention to provide coatings for porous substrates for enhanced lubrication with conventional lubricants.

It is another object of the invention to provide improved lubricant coatings for low friction response in composite bearing members, such as members made of carbon-carbon.

It is yet another object of the invention to provide coatings for enhanced lubrication of bearing elements fabricated from porous carbon or polymer containing composites.

It is yet another object of the invention to improve the lubrication of cotton-phenolic composite bearing elements.

It is yet another object of the invention to improve the lubrication of carbon-phenolic composite bearing elements.

It is yet another object of the invention to provide a lubricant for carbon-carbon composite bearing elements for operation at high temperature.

It is a further object of the invention to provide a lightweight, high strength carbon-carbon composite rolling element bearing cage for operation at high temperature.

It is another object of the invention to provide a lightweight, high strength carbon-carbon composite bearing elements rolling element bearing cage for operation at high temperature.

It is yet another object of the invention to provide a lubricant for carbon-carbon composite rolling element bearing assemblies having improved thermal conductivity.

It is yet another object of the invention provides a lubricant for carbon-carbon composite bearing elements for operation in a vacuum environment.

It is yet another object of the invention to provide composite bearing cages having substantially lower heat generation as compared to an all-metal cage.

It is another object of the invention to provide improved cages, retainers or separators.

It is another principal object of the invention to provide enhanced low friction response of rolling bearing elements and cages of cotton-phenolic, carbon-phenolic or carbon-carbon composites.

These and other objects of the invention will become apparent as a detailed description of representative embodiments proceeds.

BRIEF DESCRIPTION OF THE DRAWINGS

Features of the present invention are disclosed in the accompanying drawings, wherein similar reference characters denote similar elements throughout the several views, and wherein.

DETAILED DESCRIPTION OF THE INVENTION

The invention provides, in part, a method for seal coating porous composite substrates for superior friction response when lubricated conventionally. The coating is applied to the composite surface to seal the porosity of the composite and prevent lubricant penetration into the composite.

Figure 1:
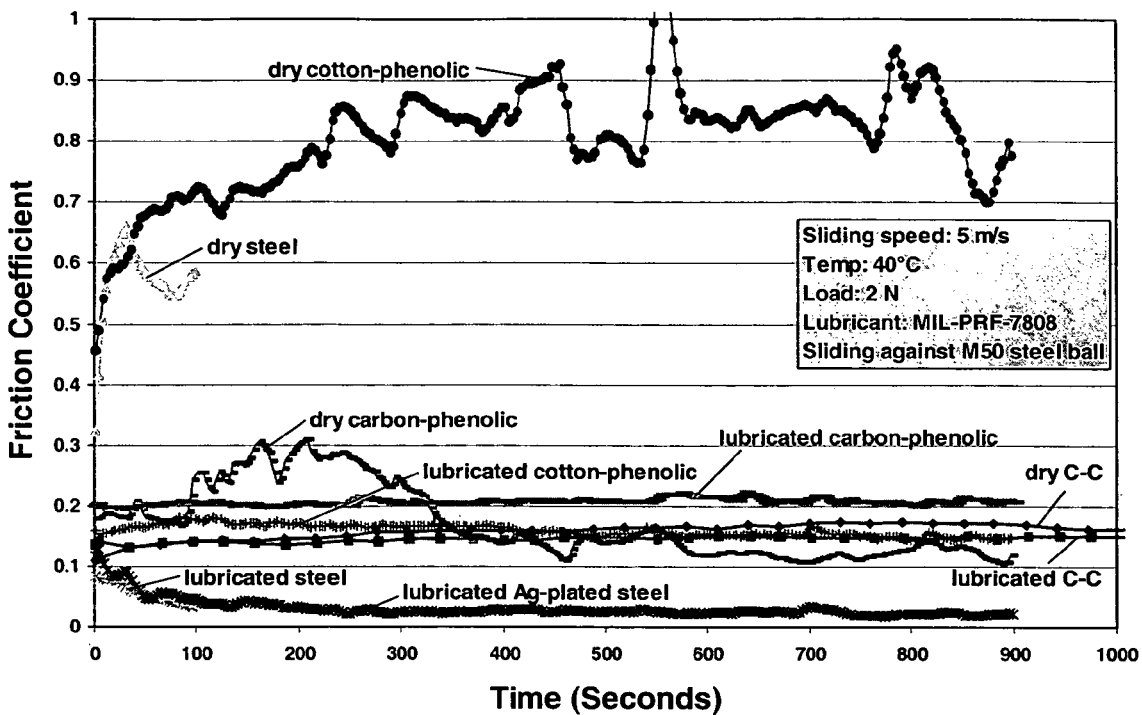
FIG. 1 is a graph showing friction coefficient versus time for examples of uncoated dry and liquid lubricated samples.

Referring now to the drawings, FIG. 1 shows plots of experimentally obtained coefficients of friction (COF) versus time obtained with a rotating steel ball loaded against stationary substrates of carbon-carbon (carbon fibers in carbon matrix), carbon-phenolic (carbon fibers in phenolic matrix), cotton-phenolic (cotton fibers in phenolic matrix) and steel under dry conditions and each substrate being lubricated with a few drops of conventional turbine engine liquid lubricant oil. Without the lubricant, cotton-phenolic demonstrates a very high. COF. The COF for dry steel is moderately high at 0.60, in part because metal oxides formed in the contact area provide some lubrication. Dry carbon-phenolic and dry carbon-carbon are both fairly low in COF because of the graphitic wear debris that is formed in the contact area.

When the liquid lubricant is applied, the carbon-carbon, carbon-phenolic, and cotton-phenolic demonstrate similar COF values of about 0.20. For the cotton-phenolic, the addition of oil dramatically lowers the COF from about 0.80 to about 0.17. However, the addition of oil has little effect on the performance for carbon-phenolic and carbon-carbon. Regardless of the substrate, cotton-phenolic, carbon-phenolic, or carbon-carbon, the degree of improvement is not normally what would be expected with the application of liquid lubricant. For example, the COF of carbon-carbon composites decreases from 0.16 under dry conditions to only 0.15 when lubricated; whereas the COF of steel drops from 0.60 under dry conditions to 0.05 when lubricated.

The composite materials do not exhibit the degree of improvement that the steel does because of the porous nature of the substrates. Normally with a liquid lubricant, a hydrodynamic film is formed that separates the two contacting surfaces. The lower friction results from the low shear properties of the oil film. With porous composites, such as cotton-phenolic, carbon-phenolic, or carbon-carbon, however, this separation does not occur. Instead, the lubricant diffuses into the substrate rather than generating a hydrodynamic lubricant film, which explains the higher friction in porous composites. Improved lubrication of porous materials may be accomplished by eliminating, or substantially reducing, porosity at the surface through the application of coatings of selected materials.

Figure 2:
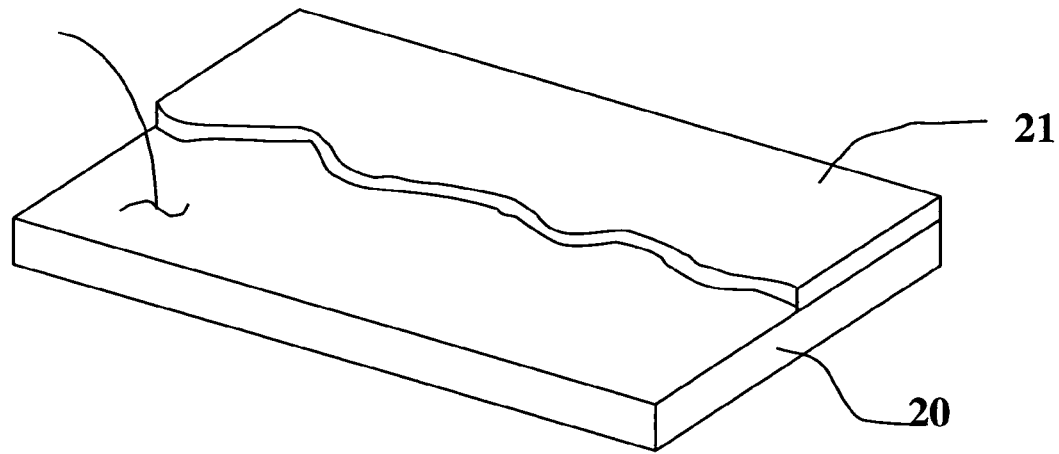
FIG. 2 is a perspective view of a substrate having a coating applied to a surface thereof.

Referring now to FIG. 2, shown therein is a sketch of a representative substrate having a coating applied a surface thereof. Substrate 20 may comprise any porous material, including phenolic, polyimide, poly-ether-ketone, and carbon, or fiber reinforced composites using these substrates and fibers made from carbon, glass, silicon carbide, or other high strength material, or other candidate materials for bearing element structures, as would occur to the skilled artisan practicing the invention. The substrate itself may comprise any of the bearing element structures in which the invention may find use as discussed above. To substrate 20 may be applied a thin coating 21 of metallic, diamond like carbon, titanium nitride, or other material for the purpose of sealing any porosity in surface 22 of substrate 20 to prevent the diffusion of lubricant into substrate 20. Candidate coating materials are discussed in more detail below.

In an exemplary embodiment, metallic coatings on porous substrates may be applied by substantially any plating or deposition method known in the applicable art, including, for example, vacuum impregnation of liquid metal at high temperature. Coating thicknesses of about 0.5 mil to 5 mil may be desirable, depending on the substrate and the coating material selection. In example demonstrations of the embodiment, low friction polymeric paint containing metallic silver was applied to both electrically conductive porous substrates and nonconductive porous substrates, including carbon-phenolic, carbon-carbon, cotton-phenolic composites, and tested for the respective COFs using a drop of gas turbine aviation lubrication. In the demonstrations, two commercially available electrically conductive paints containing silver, acrylic based Dynaloy 340 containing pure silver particles and epoxy based Dupont 5815 containing 55% by weight of silver were used. Cotton-phenolic, carbon-phenolic, and carbon-carbon substrates were coated (brushed or sprayed) with thin (0.5 to 5 mil) layers of the paints and heat cured under vacuum. The Dynaloy 340 painted substrates were cured at 150-175° C., and the Dupont 5815 painted substrates were cured at 160° C. To assure the best adhesion, composite specimens were carefully cleaned by a solvent such as acetone and dried in an air circulating oven at 110° C., and spray painted with silver paint previously diluted with cellosolve acetate. To ensure coating uniformity, the test articles were placed on a self-rotating table while being sprayed. Multiple sprays with intermediate drying and staging steps were used in order to attain a cured painted coating thickness of about 2 to 3 mils.

In further tests, Dynaloy 340 coated carbon-phenolic substrates were electro-deposited with an additional layer of electro-deposited silver, and carbon-carbon substrates were coated with Dynaloy 340 and further coated with an electro-deposited silver layer. The silver in the paint layer rendered the (nonconductive) surfaces of the cotton-phenolic and carbon-phenolic substrates sufficiently conductive to allow plating using a conventional electrolytic process.

In another embodiment, the surface porosity of an electrically conductive carbon-carbon composite substrate was sealed first with an electrodeposited copper flash coating followed by an electro-deposited silver coating. Carbon-carbon composite is reasonably electrically conductive and can be plated using well-established electrolytic or electro-less plating processes. The substrate surface was first thoroughly cleaned (ultrasonically) and electrolytically plated with a thin (1 to 2 mils) layer of copper. Copper was selected for the initial coat because it is easier to plate on the carbon substrate than silver, exhibits better adhesion to the substrate and promotes adhesion of the silver coating. The substrate was plated over the copper layer with a thin (0.5 to 1 mil) layer of silver, and a COF of about 0.05 was obtained when a drop of aviation lubricant was applied. It is noted that other materials may be used as the sealing layer, including boron nitride (applied by chemical vapor infiltration), diamond like carbon, titanium-carbon-carbon, and metals such as silver, aluminum, or lead, or other appropriate metallic or non-metallic sealing layer as would occur to the skilled artisan guided by these teachings, silver being chosen to demonstrate the invention as having excellent boundary lubrication properties.

In another exemplary embodiment, carbon-carbon composite substrates were coated with a carbon seal coat chemical vapor deposition (CVD) layer to close the surface porosity of the substrates. The substrates were placed inside a standard CVD furnace, and elemental carbon was deposited onto the exposed surfaces (both fibers and carbon matrix). As the carbon deposit accumulates, porosities are sealed and an impervious carbon seal coat is formed on the surface of the carbon-carbon article. Once sealed, coatings with good tribological properties such as diamond like carbon, hexagonal born nitride, titanium nitride, or other suitable low friction coating may be applied to enhance the boundary lubrication mode.

Figure 3:
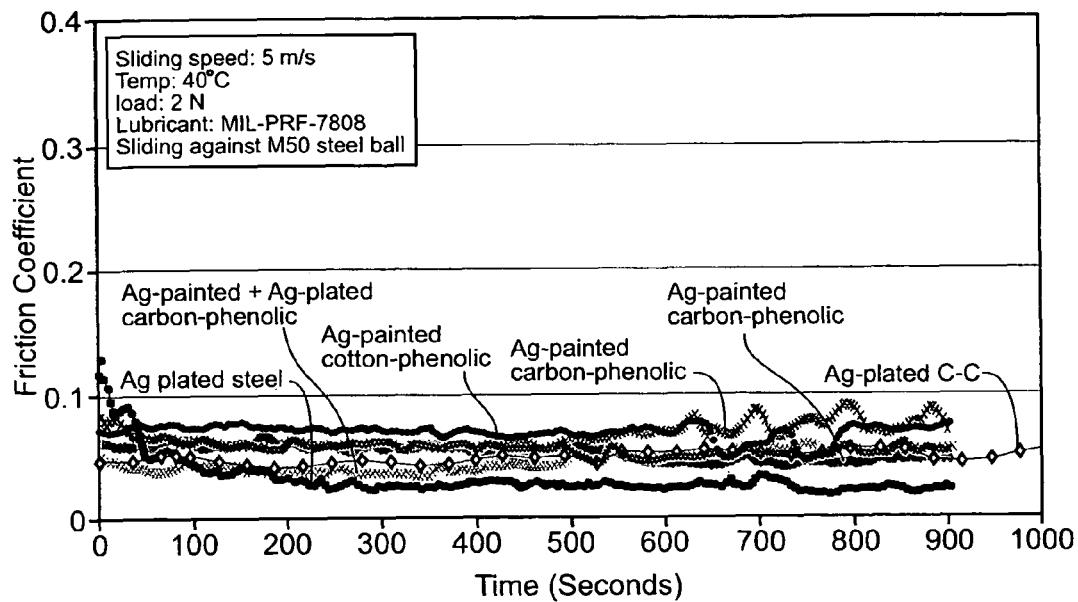
FIG. 3 is a graph showing friction coefficient versus time for examples of coated liquid lubricated composite samples.

The results are shown in FIG. 3. By sealing the surface porosity of the substrates with silver-based coatings, a significant reduction in friction resulted when lubricated with turbine engine oil. Friction is now closer to that of liquid lubricated solid surfaces such as silver plated steel.

Other processes for coating the composite substrates may be used as would occur to the skilled artisan practicing the invention, including infiltrating a porous carbon-carbon substrate with liquid silver at high temperature under an inert atmosphere, physical vapor deposition or plasma deposition of metallic silver, impregnating a conductive filler into the nonconductive porous substrate in order to render the substrate conductive to facilitate a subsequent electro-deposition process, or impregnating a porous substrate with a liquid to produce a glassy carbon coating followed by heat treatment to convert the liquid to glass to seal the surface porosity of the substrate.

The invention may be applied to substantially any porous substrate, such as those of carbon or polymers such as phenolic, polyimide, or poly-ether-ether-ketone. These substrates may be reinforced with fibers to produce a composite with improved mechanical or thermal performance. Once sealed, the substrates may be successfully lubricated with substantially any of the conventionally used liquid lubricants useful in the lubrication of bearing structures, such as refined petroleum products used as automobile lubricants and other common applications, and high performance synthetic lubricants such as polyolesters, poly-alpha-olefins and multiply-alkylated cyclopentanes.

The present invention also provides other processes for applying metal, tribological coatings to carbon-carbon substrates for the purpose of reducing friction. The application of the coating proceeds in several steps to improve adherence and to arrive at a final coating layer that will have good tribological properties. The initial layer in this process is first depositing a Chemical Vapor Deposited layer of carbon (CVD-C) on the C—C substrate. This layer reduces loose carbon at the interface. The CVD-C layer is followed by an aluminum (Al) layer. Al can react with carbon to provide a chemical bond at the Al/CVD-C layer to provide a metal surface that will have good adhesion at the carbon interface. In the present invention, cages and friction test specimens were annealed after the Al coating at a temperature slightly higher than the melting temperature of Al. This high temperature treatment results in melting of the Al coating which helps further bond Al coating to the C—CVD layer. After annealing, a Ag layer, or a mixed Al and Ag composite layer, is then deposited on the Al layer. If a mixed Al and Ag layer is used, then an additional Ag layer is deposited on top of it.

The present invention was demonstrated by depositing the Al, the mixed Al/Ag composite layer, and Ag layer by a physical vapor deposition (PVD) using an energetic plasma process. However, several other methods exist which could also apply these metal coatings; such as, electron beam evaporation, sputter deposition, ion plating, and chemical or plasma enhanced vapor deposition. This metal coating process seals the pores, provides low friction under liquid lubrication, and is adherent to C—C substrate due to a chemically reacted bonding layer at the carbon/aluminum interface. Both the C—CVD and the Al layer are critical steps to improve adhesion of the metal coating system. After this step there are numerous coatings that can be applied to Al to improve tribology that would not normally stick to a carbon substrate. In the present invention Ag was used. Ag is a metal known to have good tribological properties due to its low shear strength. It is commonly used on metal bearing cages to improve boundary lubrication performance. Without the pretreatment of the CVD-C layer and the Al, Ag would not have good adherence on a carbon material.

The coating described here is beneficial for bearing cages used in gas turbine engines. In gas turbines, the metal coated C—C would replace Ag plated steel cages. The lower density of the C—C cage can reduce bearing heat generation by as much as 80% compared to an all metal cage. C—C cages coated in this manner would also be beneficial to turbochargers for internal combustion engines and bearings used to support the rotating anode in medical x-ray machines. Bearings in the medical x-ray machine application frequently use Ag coating of the bearing components to reduce friction and wear. These bearings don't use liquid lubrication and typically don't use a bearing cage due to the harsh thermal environment. A C—C bearing cage would have desirable mechanical and material properties for the x-ray machine application and a coating of Ag, or other low shear metal, could be beneficial to further improve a C—C cage for this particular application.

Figure 4:
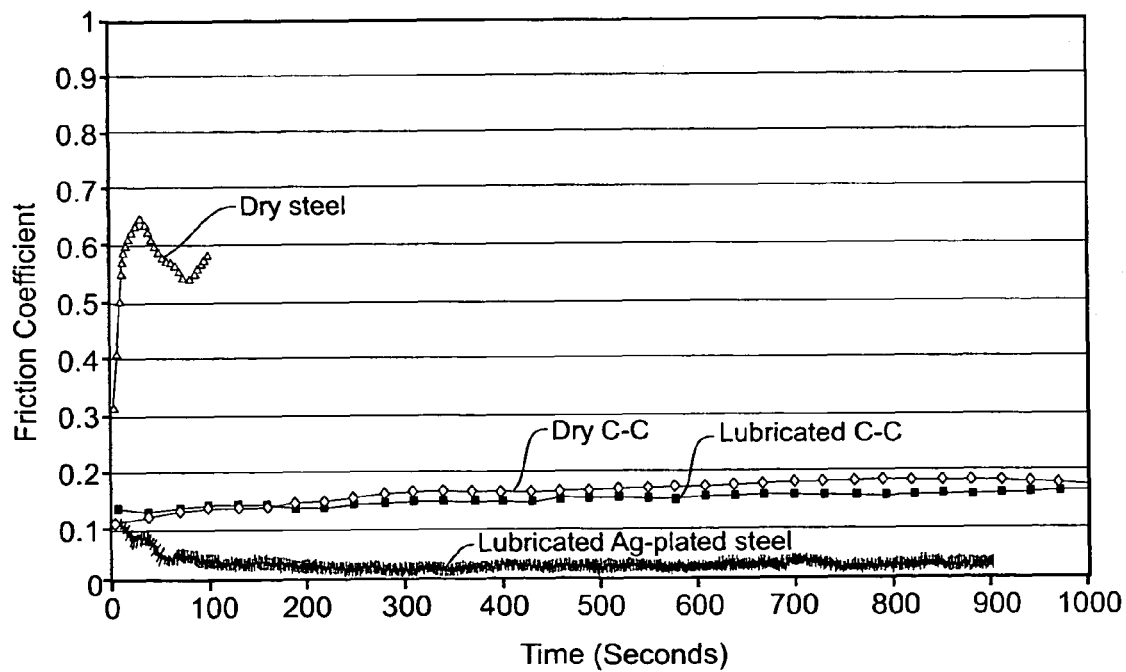
FIG. 4 is a graph showing friction coefficient versus time for examples of uncoated dry and liquid lubricated samples.

As previously described, carbon substrates have inherent porosity. Porosity affects the ability of C—C composites to form hydrodynamic lubricant films. As shown in FIG. 4, the friction coefficient of uncoated oil lubricated C—C is not significantly reduced when compared to dry conditions. When the porous substrate is sealed by a suitable coating, the coefficient of friction can be dramatically reduced as previously shown in FIG. 3. Note that the dry coefficient of friction for C—C is in the range of 0.18. A slight reduction occurs when the specimen is liquid lubricated, reducing the coefficient of friction to about 0.16 but when a suitable coating is applied which seals the C—C substrate, the coefficient of friction goes to about 0.06. This reduction is due to the formation of a hydrodynamic film that allows shear to occur primarily in the lubricant film rather than the substrate material. However, it is often the case that some localized contact will occur at asperities through the lubricant film, and it is desirable to have a low shear metal such as Ag to further reduce friction at these localized asperity contacts. This is particularly the case with high sliding contacts such as those found in bearing cages. If a coating, such as Ag is used, it also must be durable and able to withstand the environment of high sliding contacts.

Figure 5:
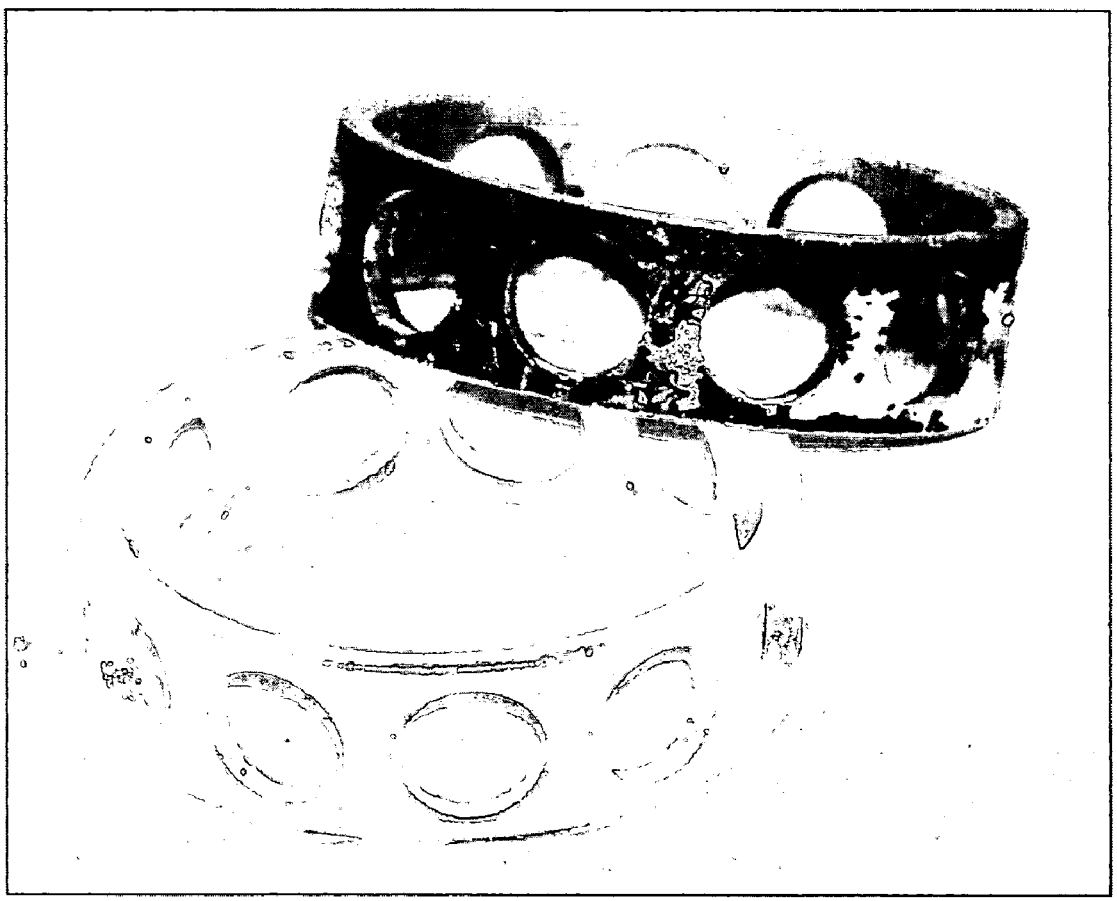
FIG. 5 is a photograph of an Ag painted cage before and after high-speed bearing testing.

Various coating system were tested that could seal the carbon substrate and lower friction. Several of these involved an organic paint that contained metallic silver. One of the coatings, Ag plated C—C, was previously described above. For the friction test shown in FIGS. 3 and 4, the coated C—C specimens were stationary and loaded against a rotating metal ball with a few drops of lubricant. In subsequent testing of full-scale bearings, the coatings, made by painting the cages, did not have sufficient adhesion to survive high-speed conditions required for gas turbine engines. As shown in FIG. 5 much of the coating came off in a test of 30 mm bore bearings tested at 17,000 rpm.

Based on the problems associated with painted coatings, new metallic coating systems were developed that could be chemically bound to the carbon substrate for improved adhesion. Going to an all metallic system and eliminating the organic paint also improves the temperature capability of many of the systems in the earlier trials. The organic paints are limited to about 200° C., but the all metal system described herein would be fully functional to 500° C.

To improve adhesion of a metallic system, trial metals known to chemically react with carbon were selected for the initial coating layer. Aluminum, titanium, iron, and tungsten were evaluated. These coatings were applied to C—C substrates with and without a chemical vapor deposition coating of carbon (CVD-C) on the C—C substrate. Visual inspection and a Sebastian pull-test to measure adhesive strength of the initial metal coatings were used for coating evaluation. Of the metals evaluated, aluminum showed the best performance. Aluminum was the initial metal coating that has been used in the development of the current coating system. The CVD-C layer also proved to be an important pre-processing step for good adhesion. The CVD-C eliminates the loose powdery film of carbon that is on C—C without the CVD-C layer. This loose powdery film impacts adhesion without the CVD-C layer. The relative thickness of the Al coating is approximately 15 microns.

Figure 6:
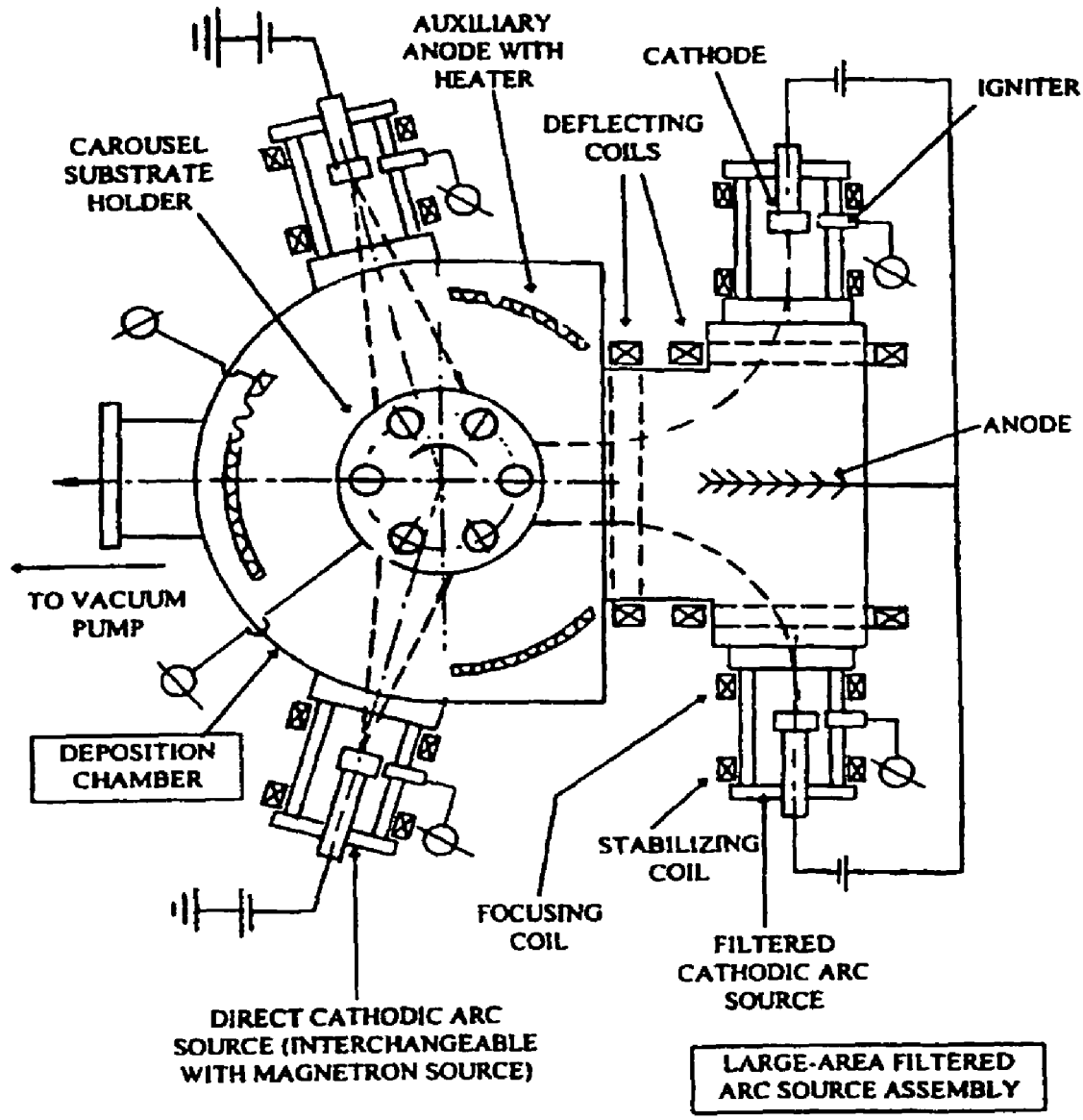
FIG. 6 is a diagram of a Large Area Dual Filtered Cathodic Arc Deposition System.

The method used to coat the aluminum layer was a physical vapor deposition (PVD) process. The specific equipment used for demonstrating the invention was the Large Area Surface Engineering System (LASES) based on superior cathodic arc deposition technology. The system is shown schematically in FIG. 6. It consists of three major components: direct arc sources, large-area filtered arc sources, and auxiliary anode assembly. The LASES uses a rectangular plasma guide chamber with two rectangular coils installed on the opposite sides. Two cathodic arc sources with rectangular or circular target are installed on the side-walls of the plasma-guide chamber surrounded by rectangular deflecting coils. A dynamic magnetic field is applied to repel the arc from the edges, and imposes a transverse field at high switching frequency to make the arc run continuously around the target by the use of multiple magnetic coils placed around the target. While this is the specific process used in this invention there are several other PVD and chemical vapor deposition (CVD) processes that could also generate an aluminum metallic layer on the C—C substrate. The other processes include, for example, electron beam evaporation, sputter deposition, ion plating, and chemical or plasma enhanced chemical vapor deposition process using a suitable precursor.

Figure 7:
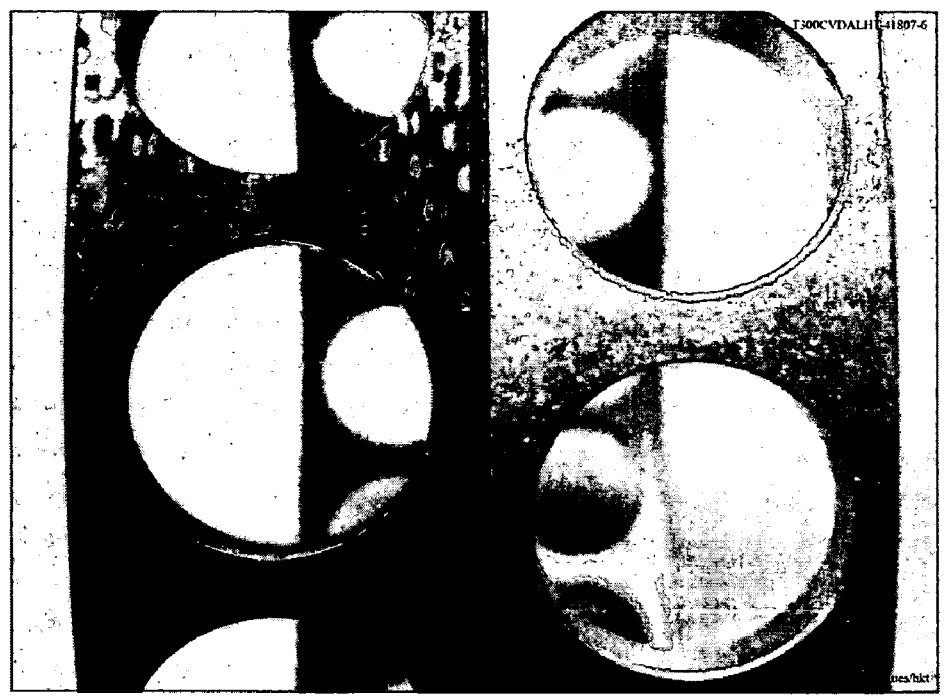
FIG. 7 is a photograph of an uncoated C—C cage and an annealed aluminum PVD coated C—C cage.

After applying the Al coating, the specimens are annealed in a furnace under vacuum or with inert gas and held at approximately 700° C. for one hour. This results in melting of the Al, filling up the pores and forming an aluminum carbide interfacial layer at the C—CVD/Al boundary. A coated cage sample at this stage of the process is shown in FIG. 7.

Figure 8:
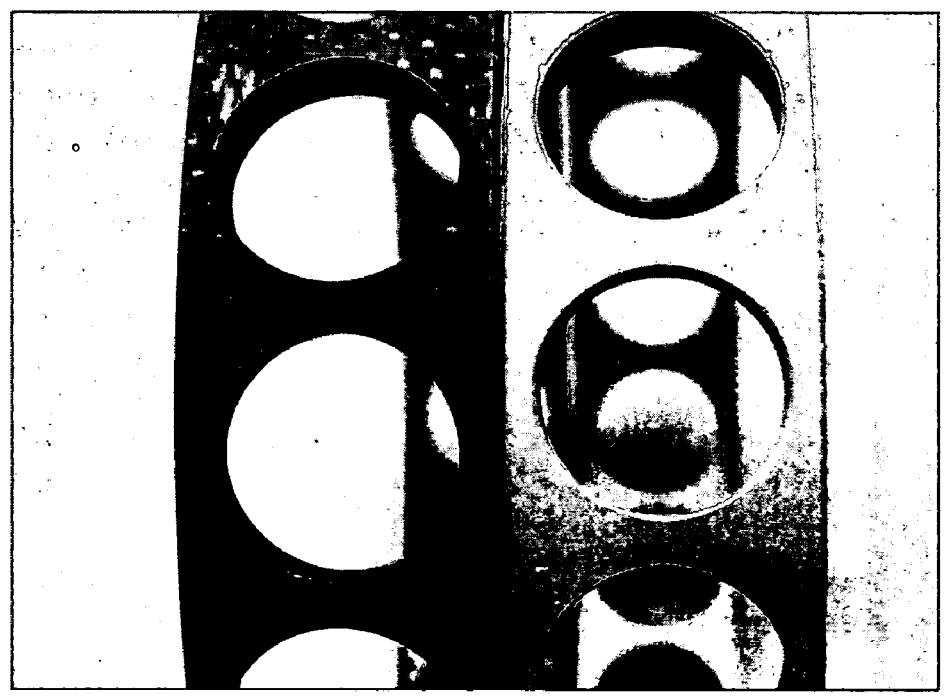
FIG. 8 is a photograph of a PVD silver coating on annealed aluminum coated C—C cage.

After annealing the Al coated specimens, the specimens are returned to the LASES chamber and a coating of Ag, or a mixed coating of Al and Ag, is produced. In the case of mixed Al and Ag coating, two separate Al and Ag cathodes are used for plasma generation. The thickness of Ag, or mixed Al and Ag with a top Ag layer, is between 1 to 5 microns. FIG. 8 depicts the bearing cage at this second stage of processing.

Figure 9:
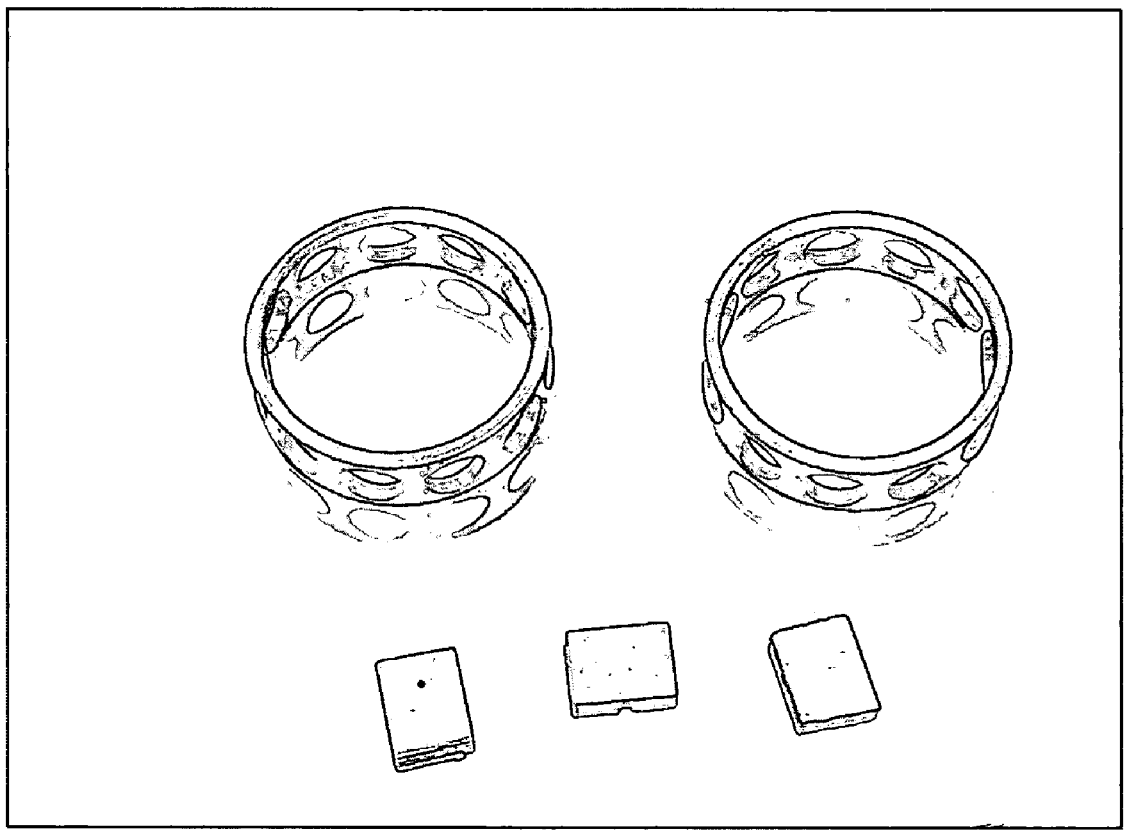
FIG. 9 is a photograph of final coated bearing cages.

At this step, the specimens are ready for electro-deposition of Ag or other tribologidal coatings. If electro-deposition of Ag is chosen, an additional silver layer of approximately 10 to 15 microns is deposited on the specimen. In the present case, the Ag layer was deposited following SAE aerospace material specification AMS 2412G without application of copper flash. The advantage of electro-deposition is that a relatively thick layer can be produced at a lower cost, using more conventional technology. This final electro-deposition of Ag can be replaced with other metal or tribological coatings that would adhere to the Al, mixed Al and Ag, or Ag coatings but not normally adhere to a carbon substrate. FIG. 9 shows final coated C—C specimens with the electro-deposited Ag tribo-layer.

Figure 10:
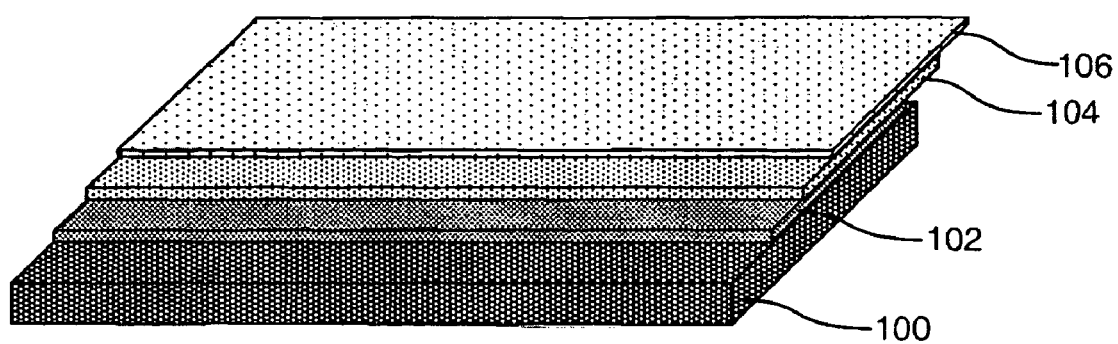
FIG. 10 is a perspective view of a substrate having a multiple-layered coating applied to a surface thereof.
Figure 11:
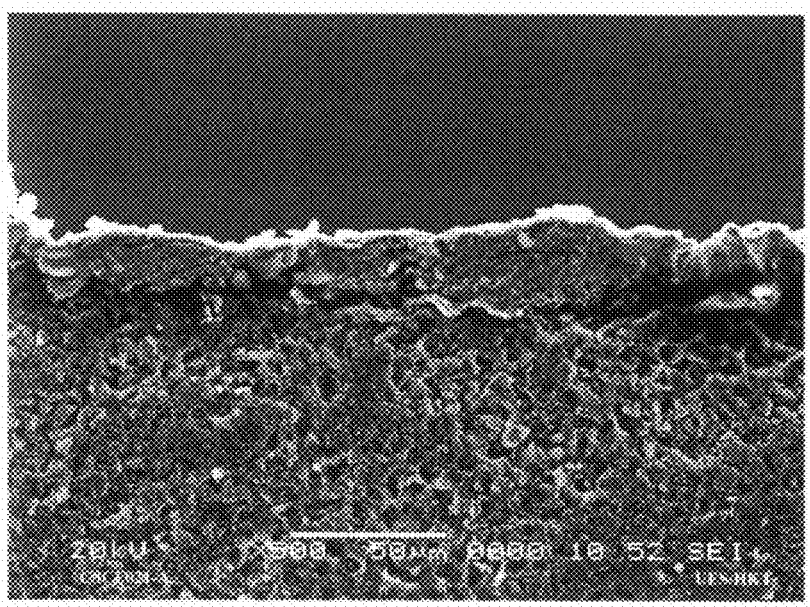
FIG. 11 is a scanning electron microscope (SEM) cross-sectional image of a final coating after C—CVD, Al, Ag vapor deposition, and Ag electro-deposition.
Figure 12:
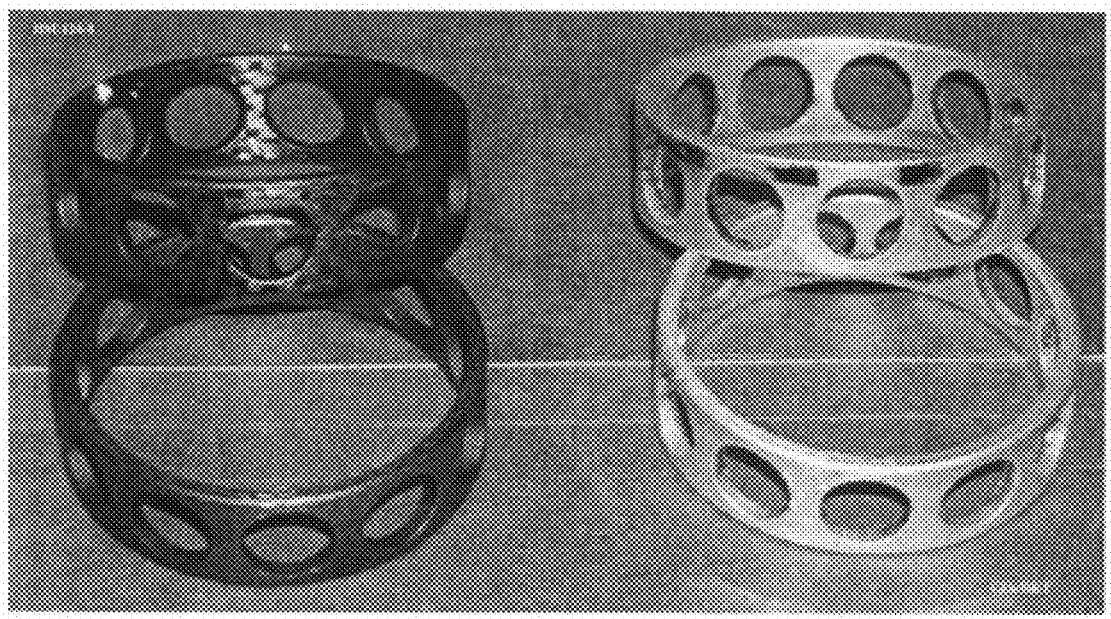
FIG. 12 is a photograph of an Ag coated cages after a high-speed bearing test.

FIG. 10 schematically shows the resulting layered coating of the present invention. The system includes a porous C—C composite substrate with CVD-C treatment 100, a PVD aluminum sub-layer 102, a PVD silver layer 104, and a thin electro-deposited silver tribo-layer 106. FIG. 11 illustrates a cross sectional sample showing coating morphology and elemental composition. Mixing of Al and Ag is desirable for adherence of Ag to the carbon substrate. FIG. 12 shows post-tested coated bearing cages. The coating remained totally intact on the bearing cage. There is some polishing wear on the cage land which appears darker in color but the coating is intact after testing at 20,000 rpm.

While various descriptions of the present invention are described above, it should be understood that the various features can be used singly or in any combination thereof. Therefore, this invention is not to be limited to only the specifically preferred embodiments depicted herein. Further, it should be understood that variations and modifications within the spirit and scope of the invention may occur to those skilled in the art to which the invention pertains. Accordingly, all expedient modifications readily attainable by one versed in the art from the disclosure set forth herein that are within the scope and spirit of the present invention are to be included as further embodiments of the present invention. The scope of the present invention is accordingly defined as set forth in the appended claims.

What is claimed is:

1. A method for applying a tribological coating to a carbon composite substrate, the method comprising:
   providing the carbon composite substrate;
   thereafter, depositing a layer of carbon on the substrate;
   thereafter, applying a layer of aluminum;
   thereafter, annealing the substrate at a temperature greater than a melting temperature of aluminum; and
   thereafter, applying a layer of silver.

2. The method of claim 1 further comprising after the step of applying the layer of silver, applying an additional layer of silver using electro-deposition.

3. The method of claim 2 wherein the layer of carbon is deposited using chemical vapor deposition.

4. The method of claim 2 wherein the layer of aluminum is applied using physical vapor deposition.

5. The method of claim 2 wherein the layer of aluminum is applied using electron beam evaporation, sputter deposition, ion plating, chemical enhanced vapor deposition, or plasma enhanced vapor deposition.

6. The method of claim 2 wherein the layer of silver is applied using physical vapor deposition.

7. The method of claim 2 wherein the layer of silver is applied using electron beam evaporation, sputter deposition, ion plating, chemical enhanced vapor deposition, or plasma enhanced vapor deposition.

8. The method of claim 2 wherein the layer of aluminum has a thickness of approximately 15 microns.

9. The method of claim 2 wherein the layer of silver has a thickness of about 1 to 5 microns.

10. The method of claim 2 where the additional layer of silver has a thickness of about 10 to 15 microns.

11. A method for applying a tribological coating to a carbon composite substrate, the method comprising:
proviing the carbon composite substrate;
thereafter, depositing a layer of carbon on the substrate;
thereafter, applying a layer of aluminum;
thereafter, annealing the substrate at a temperature greater than a melting temperature of aluminum; and
thereafter, applying a layer of mixed aluminum and silver.

12. The method of claim 11 further comprising after the step of applying the layer of mixed aluminum and silver, applying a layer of silver using electro-deposition.

13. The method of claim 12 wherein the layer of carbon is deposited using chemical vapor deposition.

14. The method of claim 12 wherein the layer of aluminum is applied using physical vapor deposition.

15. The method of claim 12 wherein the layer of aluminum is applied using electron beam evaporation, sputter deposition, ion plating, chemical enhanced vapor deposition, or plasma enhanced vapor deposition.

16. The method of claim 12 wherein the layer of mixed aluminum and silver is applied using physical vapor deposition.

17. The method of claim 12 wherein the layer of mixed aluminum and silver is applied using electron beam evaporation, sputter deposition, ion plating, chemical enhanced vapor deposition, or plasma enhanced vapor deposition.

18. A method for applying a tribological coating to a carbon composite substrate, the method comprising:
providing the carbon composite substrate;
thereafter, depositing a layer of carbon on the substrate using chemical vapor deposition;
thereafter, applying a layer of aluminum using physical vapor deposition, the layer of aluminum having a thickness of approximately 15 microns;
thereafter, annealing the substrate;
thereafter, applying a layer of silver using physical vapor deposition, the layer of silver having a thickness of about 1 to 5 microns; and
thereafter, applying an additional layer of silver using electro-deposition, the additional layer of silver having a thickness of about 10 to 15 microns.

\* \* \* \* \*